United States Patent
Fan et al.

(10) Patent No.: US 7,327,585 B1
(45) Date of Patent: Feb. 5, 2008

(54) DATA STORAGE DEVICE CARRIER

(75) Inventors: Chen-Lu Fan, Taipei Hsien (TW);
Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/733,212

(22) Filed: Apr. 10, 2007

(30) Foreign Application Priority Data

Dec. 15, 2006 (CN) .......................... 2006 2 0016272

(51) Int. Cl.
*H05K 9/00* (2006.01)
(52) U.S. Cl. ........................................ 361/816; 439/607
(58) Field of Classification Search ................ 361/816, 361/818, 799, 685; 439/607
See application file for complete search history.

(56) References Cited

U.S. PATENT DOCUMENTS 4,780,570 A 10/1988 Chuck
6,590,848 B1 * 7/2003 Chen .......................... 720/654

* cited by examiner

*Primary Examiner*—Javaid H. Nasri
(74) *Attorney, Agent, or Firm*—Frank R. Niranjan

(57) ABSTRACT

A data storage device carrier includes a case and an assembly mounted on the case. One side of the case defines a hole. The assembly includes a cover and a shield secured on the cover. The shield includes an elastic piece with a protrusion formed thereon configured to insert in the hole of the case to secure the assembly onto the case. The cover includes a teeterboard-type actuating member with a middle portion of the actuating member connected to the cover. An inner portion of the actuating member is connected with the elastic piece, and an outer portion of the actuating member forms an operating portion thereon configured to move the inner portion of the actuating member in a direction to drive the protrusion of the elastic piece to withdraw from the hole by operation of the operating portion in an opposite direction.

17 Claims, 4 Drawing Sheets

DATA STORAGE DEVICE CARRIER

BACKGROUND OF THE INVENTION

1. Field of the Invention

The present invention relates to a data storage device carrier, and more particularly to a data storage device carrier with an electromagnetic interference (EMI) shield.

2. Description of Related Art

A conventional computer enclosure usually defines a plurality of bays to receive and accommodate different data storage devices such as hard disk drives, optical disk drives, and other drives. These electronic components are capable of conducting electromagnetic signals, which can significantly impact the performance of other electronic components.

To solve the electromagnetic interface problem, shielding components of highly conductive material for these electronic components are necessary. One common response to this necessity is to use EMI shields mounted on a front panel of the computer enclosure to electrically contact the electronic components. Each shield includes a plurality of spring fingers around the corresponding electronic component to make grounding contact with the electronic component. However, the shield is usually secured on the front panel via screws, which is tedious when attaching or detaching the shield.

SUMMARY OF THE INVENTION

A data storage device carrier includes a case and an assembly mounted on the case. One side of the case defines a hole. The assembly includes a cover and a shield secured on the cover. The shield includes an elastic piece with a protrusion formed thereon configured to insert in the hole of the case to secure the assembly onto the case. The cover includes a teeterboard-type actuating member with a middle portion of the actuating member connected to the cover. An inner portion of the actuating member is connected with the elastic piece, and an outer portion of the actuating member forms an operating portion thereon configured to move the inner portion of the actuating member in a direction to drive the protrusion of the elastic piece to withdraw from the hole by operation of the operating portion in an opposite direction.

Other advantages and novel features of the present invention will become more apparent from the following detailed description of preferred embodiment when taken in conjunction with the accompanying drawings, in which:

DETAILED DESCRIPTION OF THE INVENTION

Figure 1:
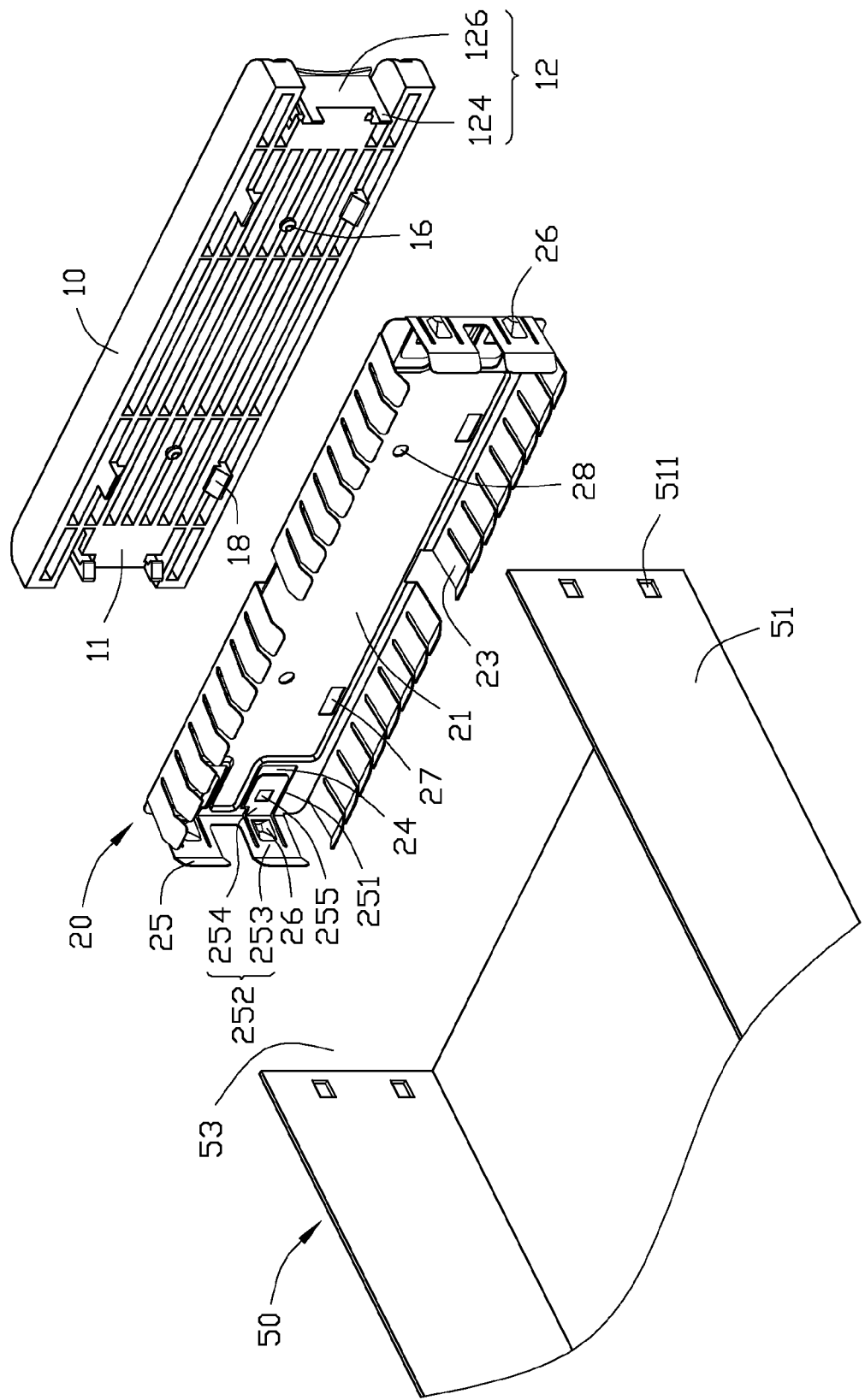
FIG. 1 is an exploded, isometric view of a preferred embodiment of a data storage device carrier, which includes a cover, a shield, and a case.

Referring to FIG. 1, a data storage device carrier in accordance with a preferred embodiment of the present invention includes a case 50, a cover 10, and a shield 20.

The case 50 forms a pair of side plates 51, and defines an opening 53 between the pair of side plates 51 accommodated to mount the cover 10 and the shield 20 thereto. Each side plate 51 defines two holes 511 on a front portion thereof adjacent the opening 53.

The cover 10 is generally a panel including an outer side adapted to face the user, and an inner side 11. The inner side 11 of the cover 10 forms two pairs of hooks 18 and a pair of positioning pins 16 thereon. A pair of teeterboard-type actuating members 12 is formed on opposite sides of the cover 10 corresponding to the pair of side plates 51. Each actuating member 12 extends in a direction perpendicular to the opening 53 of the cover 50. A middle portion of each actuating member 12 is connected to the cover 10. An outer portion of each actuating member 12 forms an operating portion 126 located beyond the outer side of the cover 10, and an inner portion of each actuating member 12 forms a pair of clasps 124 located beyond the inner side 11 of the cover 10. The pair of clasps 124 can move in a direction by operation of the operating portion 126 in an opposite direction.

The shield 20 includes a main body 21. An area of the main body 21 is generally equal to an area of the inner side 11 of the cover 10. The main body 21 defines two pairs of securing holes 27 corresponding to the two pairs of hooks 18 of the cover 10, and a pair of positioning holes 28 corresponding to the pair of positioning pins 16 of the cover 10. Top and bottom edges of the main body 21 extend rearward to form a plurality of spring fingers 23. Left and right edges of the main body 21 also extend rearward to form a pair of spring fingers 25 thereof respectively. The fingers 25 are generally parallel to the side plates 51. Each finger 25 on the left and right edges of the main body 21 defines a pair of parallel grooves 251 therein. The grooves 251 of the fingers 25 extend in a horizontal direction from the fingers 25 into the main body 21, and communicate with a corresponding one of four vertical slots 24 defined in the main body 21. Therefore, the fingers 25 together with portions of the main body 21 at opposite sides thereof form four "L"-shaped elastic pieces 252. Each elastic piece 252 includes a first portion 253 and a second portion 254 having a free end. The second portion 254 is perpendicular to the first portion 253 and coplanar with the main body 21. A part of each first portion 253 protrudes perpendicularly to form a protrusion 26 on an outside surface thereof. Each second portion 254 defines a hole 255 therein for the corresponding clasp 124 of the cover 10.

Figure 2:
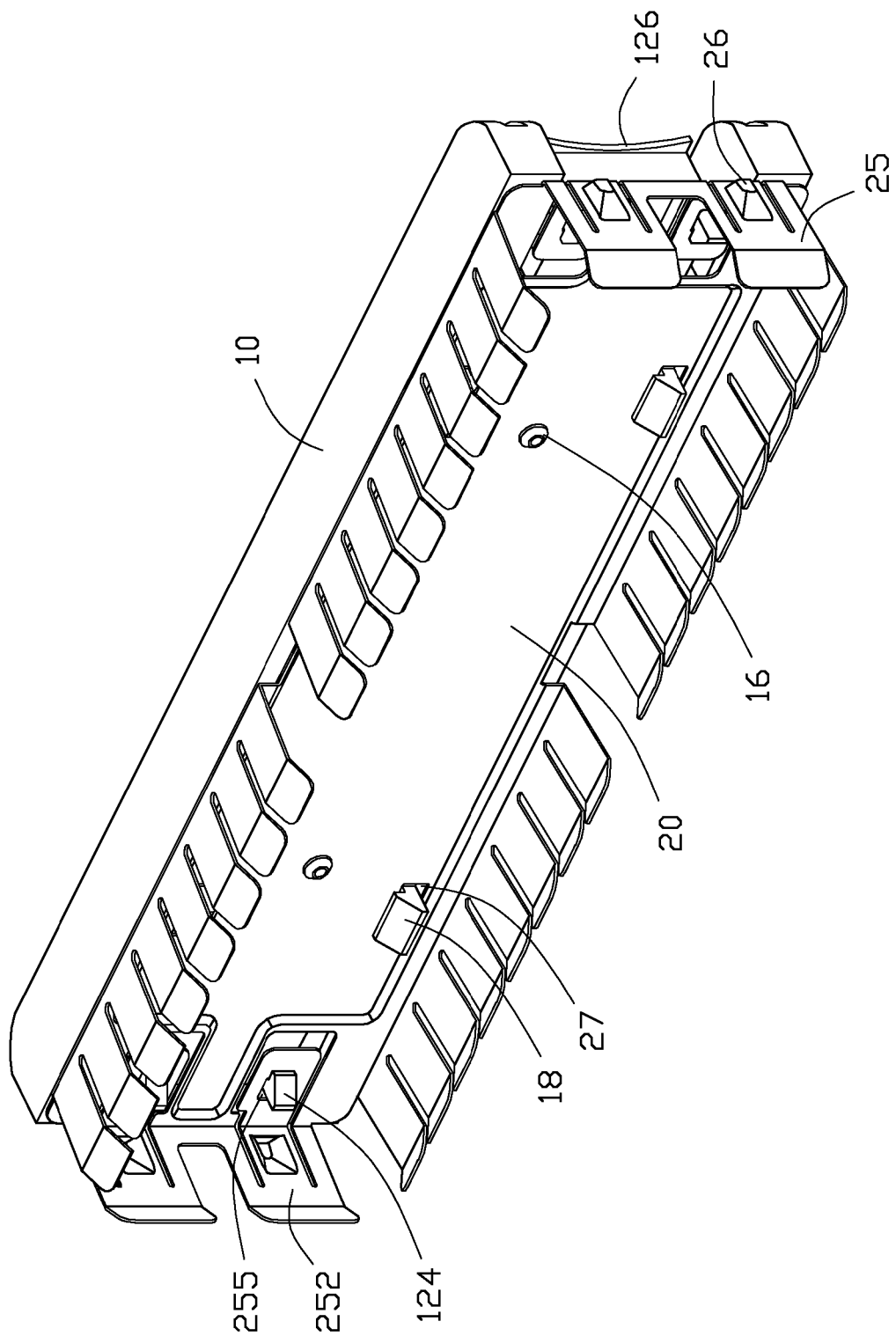
FIG. 2 is an assembly view of the cover and the shield of FIG. 1.
Figure 3:
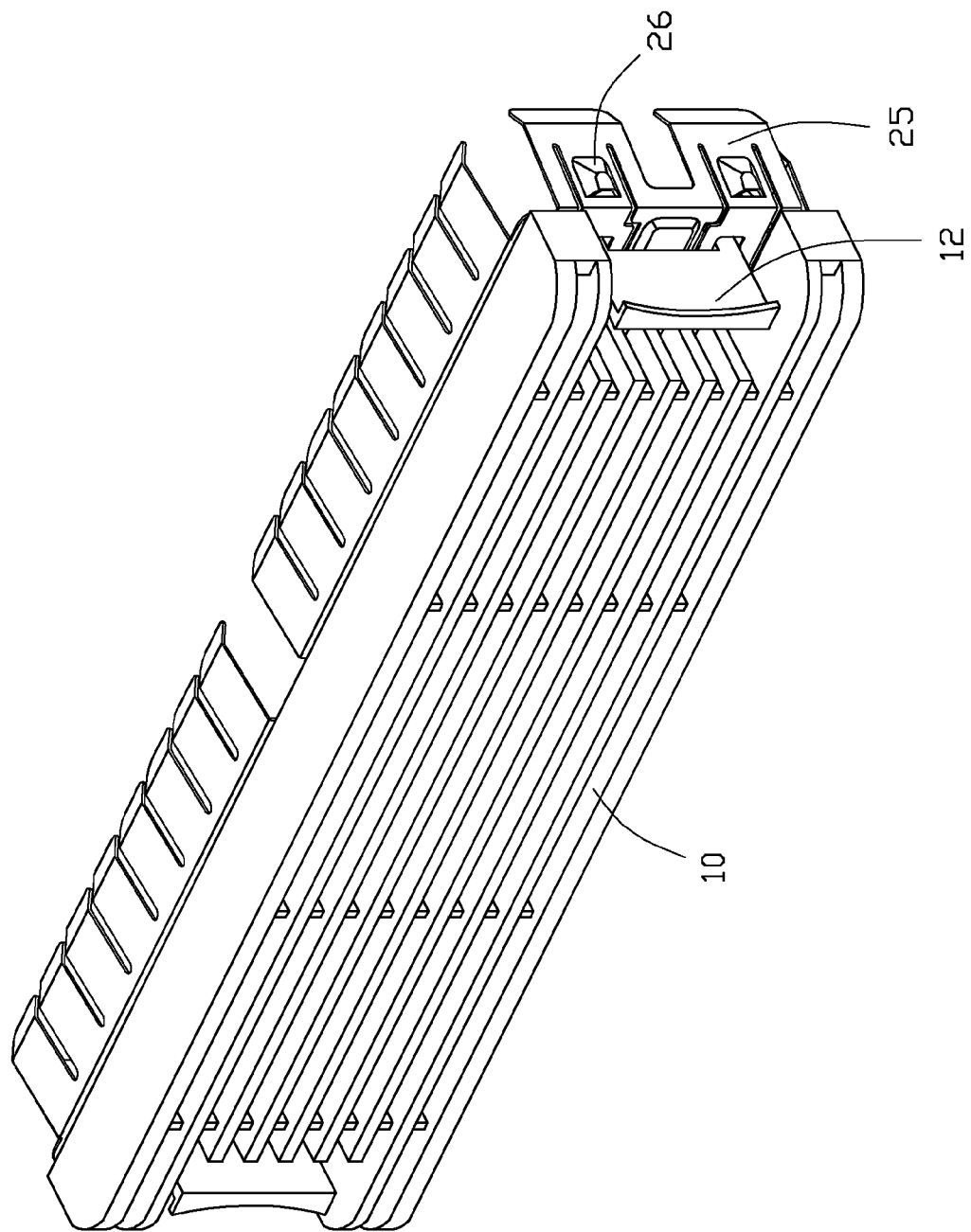
FIG. 3 is similar to FIG. 2, but viewed from another aspect.
Figure 4:
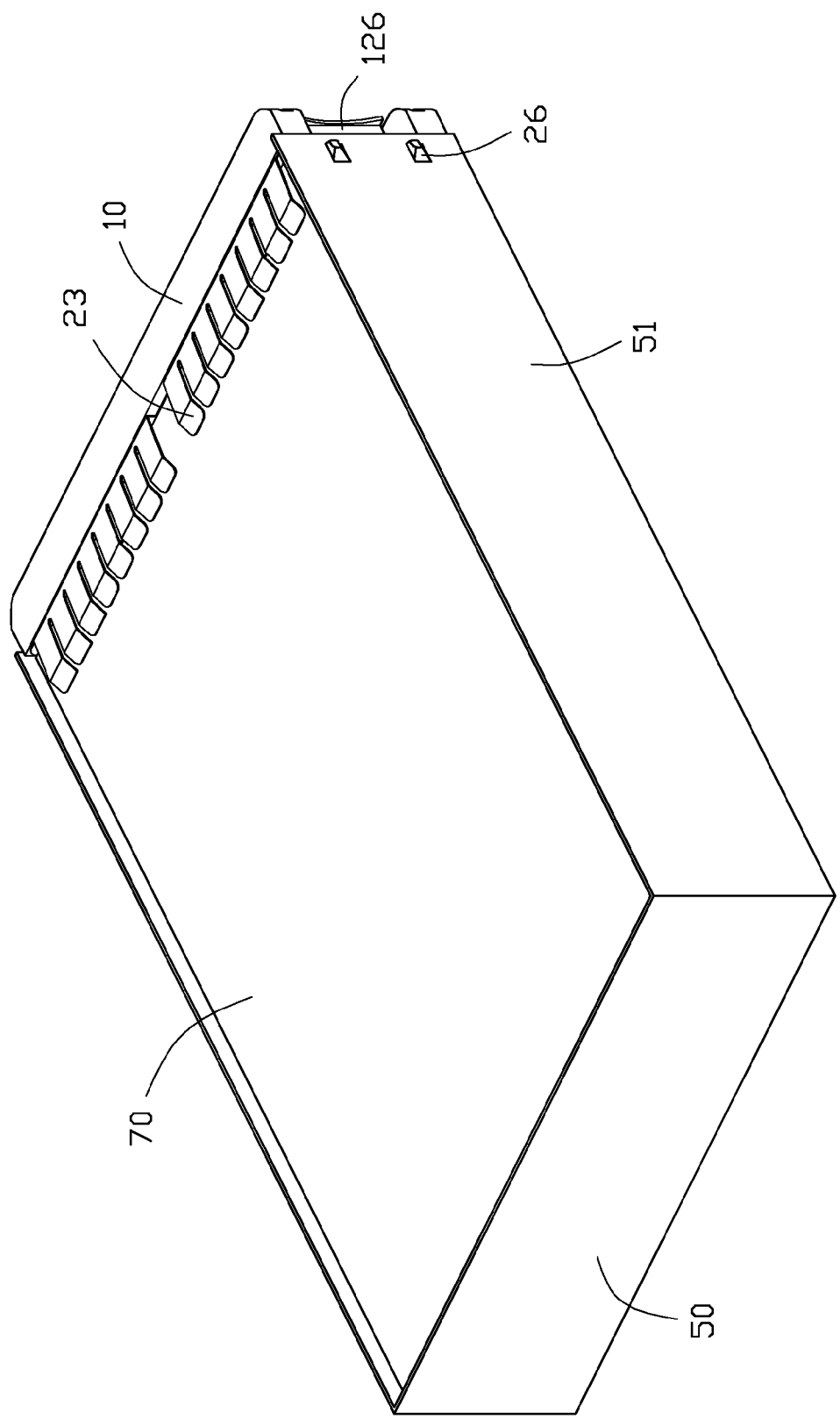
FIG. 4 is an assembled view of the data storage device carrier of FIG. 1.

Referring to FIGS. 2, 3, and 4, in assembly of the data storage device carrier, the positioning pins 16 of the cover 10 are aligned with the corresponding positioning holes 28 of the shield 20. The hooks 18 of the cover 10 extend through the corresponding securing holes 27 of the shield 20, and clip on the shield 20 to secure the cover 10 on the shield 20. Simultaneously, the clasps 124 of the cover 10 extend through the corresponding holes 255, and clip on the second portions 254 of the elastic pieces 252 to couple the actuating members 12 with the elastic pieces 252.

The case 50 receives a data storage device 70 therein. The assembly of the cover 10 and the shield 20 is then moved into the case 50 via the opening 53 to close the opening 53. The protrusions 26 of the shield 20 abut against the inner sides of the side plates 51 to flexibly bend the elastic pieces 252 of the shield 20. The fingers 23, 25 of the shield 20 flexibly contact an outer surface of the data storage device 70 to improve electromagnetic interference shielding. The assembly of the cover 10 and the shield 20 is moved until the protrusions 26 are aligned with the holes 511 of the side plates 51. Then, the elastic pieces 252 rebound to have the protrusions 26 inserted into the holes 511 to secure the assembly of cover 10 and the shield 20 onto the case 50.

In disassembly of the data storage device carrier, the operating portions 126 of the two actuating members 12 are pushed outwardly to tilt the clasps 124 inwardly. The clasps 124 drive the second portions 254 of the elastic pieces 252 to move inwardly. The first portions 253 of the elastic pieces 252 are bent inwardly, and the protrusions 26 on the first portions 253 move inwardly to escape from the holes 511 of the side plates 51. Then, the assembly of the cover 10 and shield 20 can be pulled outwardly from the case 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A data storage device carrier, comprising:
    a case configured for receiving a data storage device therein, one side of the case defining a hole; and
    an assembly comprising a cover and a shield secured on the cover, the shield comprising an elastic piece with a protrusion formed thereon configured to insert in the hole of the case to secure the assembly onto the case, the cover comprising a teeterboard-type actuating member with a middle portion of the actuating member connected to the cover, an inner portion of the actuating member connected with the elastic piece, and an outer portion of the actuating member forming an operating portion thereon configured to move the inner portion of the actuating member in a direction to drive the protrusion of the elastic piece to withdraw from the hole by operation of the operating portion in an opposite direction.

2. The data storage device carrier as described in claim 1, wherein the case comprises a pair of side plates, an opening is defined between the pair of side plates, and the assembly is mounted between the pair of side plates to close the opening.

3. The data storage device carrier as described in claim 2, wherein the shield forms a plurality of fingers for contacting the data storage device, the hole is defined in one of the side plates, at least one of the fingers face the one of the side plates, the elastic piece is formed on the at least one finger, and the protrusion is perpendicularly protruded from the elastic piece.

4. The data storage device carrier as described in claim 3, wherein the elastic piece has a portion with a free end extending perpendicular to the at least one finger, and the inner portion of the actuating member is connected with the portion of the elastic piece.

5. The data storage device carrier as described in claim 4, wherein the portion of the elastic piece defines a hole therein, and the inner portion of the actuating member forms a clasp to insert into the hole of the elastic piece.

6. The data storage device carrier as described in claim 1, wherein at least one positioning pin is formed on an inner side of the cover, and the shield defines at least one positioning hole configured for receiving the at least one positioning pin.

7. The data storage device carrier as described in claim 1, wherein the shield defines a plurality of securing holes, and the cover forms a plurality of hooks on the inner side thereof configured for engaging in the securing holes to secure the shield onto the cover.

8. A data storage device carrier, comprising:
    a case comprising a pair of side plates and defining an opening between the pair of side plates;
    a cover mounted on the case to close the opening, the cover comprising an actuating member; and
    a shield secured in an inner side of the cover, the shield comprising a main body, the main body forming at least one finger bent into the case and parallel to the side plates of the case, the at least one finger defining a pair of grooves which extend into the main body and are communicated with each other in the main body to form an elastic piece on a junction of the at least one finger and the main body, a portion of the elastic piece located at the at least one finger forming an engagement implement configured to engage with one of the side plates of the case to mount the shield and the cover on the case, another portion of the elastic piece located at the main body and connected to the actuating member for being moved in by operation on the actuating member to bend the elastic piece to disengage the engagement implement from the one of side plates.

9. The data storage device carrier as described in claim 8, wherein the actuating member is located perpendicular to the opening with a middle portion connected to the cover.

10. The data storage device carrier as described in claim 9, wherein an inner portion of the actuating member is received in the case to couple with the another portion of the elastic piece located at the main body, and an outer portion of the actuating member remains outside of the case for convenient operation.

11. The data storage device carrier as described in claim 8, wherein the portion of the elastic piece located at the at least one finger protrudes perpendicularly to form the engagement implement, and one of the side plates defines a hole to receive the engagement implement.

12. The data storage device carrier as described in claim 8, wherein at least one positioning pin is formed on the inner side of the cover, and the shield defines at least one positioning hole configured for receiving the at least one positioning pin.

13. The data storage device carrier as described in claim 8, wherein the shield defines a plurality of securing holes, and the cover forms a plurality of hooks on the inner side thereof configured for engaging in the securing holes to secure the shield onto the cover.

14. A data storage device carrier assembly, comprising:
    a case accommodating the data storage device therein, the case comprising a pair of side plates and an opening between the pair of side plates;
    a cover mounted to the case to close the opening, the cover comprising an actuating member; and
    a shield located between the data storage device and the cover and fixed to an inner side of the cover, the shield comprising a main body and a plurality of fingers extending from the main body and elastically abutting against the data storage device, at least one elastic piece formed at one side of the main body facing one of the side plates of the case, a groove being defined at the shield surrounding the at least one elastic piece except a fixed end thereof which connects the at least one elastic piece with the shield, an engagement structure being formed at the at least one elastic piece adjacent to the fixed end configured for engaging with the one of the side plates of the case to secure the shield and the cover to the case, the actuating member secured with the at least one elastic piece adjacent to a free end thereof opposing the fixed end and capable of driving the elastic piece to move away from the one of the side plates to disengage the engagement structure from the one of the side plates.

15. The data storage device carrier assembly as described in claim 14, wherein the elastic piece comprises a first portion adjacent to the fixed end and perpendicular to the main body, and a second portion extending from the first portion to the main body and separated from the main body by the groove, the engagement structure is formed at the first portion and the actuating member is secured with the second portion.

16. The data storage device carrier assembly as described in claim 15, wherein the actuating member comprises an outer portion exposed at outside of the case, a middle portion connecting with the cover, and an inner portion with a clasp formed thereat and secured with the second portion of the elastic piece, the outer portion is operated to move in one direction to cause the inner portion to move in another direction reverse to the one direction which results in the elastic piece rotating about the fixed end to actuate the engagement structure disengaging from the one of the side plates.

17. The data storage device carrier assembly as described in claim 16, wherein the one of the side plates defines a hole, and the engagement structure comprises a protrusion projecting from the elastic piece configured for being inserting into the hole.

* * * * *